US010459312B2

(12) United States Patent
Barquero Garro et al.

(10) Patent No.: US 10,459,312 B2
(45) Date of Patent: *Oct. 29, 2019

(54) PRISMATIC OPTICAL LOGIC CIRCUITS

(71) Applicant: International Business Machines Corporation, Armonk, NY (US)

(72) Inventors: Pablo F. Barquero Garro, Heredia (CR); Ricardo A. Golcher, Heredia (CR); Franz F. Liebinger, Heredia (CR); Meller J. P. Nunez, Heredia (CR)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/124,380

(22) Filed: Sep. 7, 2018

(65) Prior Publication Data
US 2019/0018302 A1     Jan. 17, 2019

Related U.S. Application Data

(63) Continuation of application No. 15/440,110, filed on Feb. 23, 2017, now Pat. No. 10,133,151.

(51) Int. Cl.
*G02F 3/00* (2006.01)
*G02B 5/04* (2006.01)
(Continued)

(52) U.S. Cl.
CPC ............... *G02F 3/00* (2013.01); *G02B 5/045* (2013.01); *B82Y 10/00* (2013.01); *B82Y 20/00* (2013.01);
(Continued)

(58) Field of Classification Search
USPC .................................................. 359/107–108
See application file for complete search history.

(56) References Cited

U.S. PATENT DOCUMENTS

| 4,254,474 A | 3/1981 | Cooper et al. |
| 4,326,259 A | 4/1982 | Cooper et al. |

(Continued)

OTHER PUBLICATIONS

U.S. Appl. No. 15/339,902, filed Oct. 31, 2016.
(Continued)

*Primary Examiner* — Jennifer D. Carruth
(74) *Attorney, Agent, or Firm* — Schmeiser, Olsen & Watts; Mark C. Vallone

(57) ABSTRACT

A media-defined optical logic circuit composed of a set of light-transmitting polyhedral prisms arranged so that a pair of adjacent prisms can exchange photonic signals through adjacent surfaces. Each prism contains one or more quantum dots that, when excited by a photonic signal received from an adjacent prism, respond by emitting light that becomes an incoming photonic signal for an adjacent prism. Photonic signals are propagated through the circuit in this manner along light-guide paths created by shading certain surfaces to render them fully or partially opaque. The prisms and shading are arranged such that the circuit performs a certain logic function. When the circuit receives a set of photonic input signals representing a binary input value, the circuit responds by emitting a set of photonic output signals that represent a binary output value determined by performing the logic function upon the binary input value.

14 Claims, 9 Drawing Sheets

(51) Int. Cl.
  *B82Y 20/00* (2011.01)
  *B82Y 10/00* (2011.01)
  *H01L 29/66* (2006.01)

(52) U.S. Cl.
  CPC .... *G02F 2202/36* (2013.01); *H01L 29/66977* (2013.01); *Y10S 977/774* (2013.01); *Y10S 977/933* (2013.01)

(56) References Cited

U.S. PATENT DOCUMENTS

| | | |
|---|---|---|
| 4,518,866 A | 5/1985 | Clymer |
| 4,591,980 A | 5/1986 | Huberman et al. |
| 4,660,166 A | 4/1987 | Hopfield |
| 4,719,591 A | 1/1988 | Hopfield et al. |
| 4,773,024 A | 9/1988 | Faggin et al. |
| 7,053,359 B2 | 5/2006 | Ponomarenko |
| 10,133,151 B2 * | 11/2018 | Barquero Garro ....... G02F 3/00 |
| 2004/0068651 A1 | 4/2004 | Pender |
| 2009/0052297 A1 | 2/2009 | Ku et al. |
| 2011/0287940 A1 | 11/2011 | Brandt |
| 2012/0063253 A1 | 3/2012 | Bae et al. |
| 2013/0107617 A1 | 5/2013 | Skold et al. |
| 2013/0135980 A1 | 5/2013 | Liu |
| 2018/0239216 A1 | 8/2018 | Barquero Garro et al. |

OTHER PUBLICATIONS

Zaghloul et al., Complete all-optical processing polarization-based binary logic gates and optical processors, Received Aug. 7, 2006, revised Sep. 17, 2006, accepted Sep. 18, 2006, Oct. 16, 2006/vol. 14, No. 21/Optics Express, pp. 9879-9895.
Notice of Allowance (dated Jul. 11, 2018) for U.S. Appl. No. 15/440,110, filed Feb. 23, 2017.

\* cited by examiner

PRISMATIC OPTICAL LOGIC CIRCUITS

This application is a continuation application claiming priority to Ser. No. 15/440,110, filed Feb. 23, 2017, now U.S. Pat. No. 10,133,151, issued Nov. 20, 2018.

BACKGROUND

The present invention relates generally to optical computer processing and specifically to the design of a logic circuit from a set of shaded optical prisms that each may contain one or more quantum dots.

Unlike conventional electrical circuits, which represent bits of data as variations in voltage levels of an electrical signal, optical (or "photonic") circuitry represents data as variations in light intensity of a photonic signal. Such light may be introduced to the circuit by any known means, such as by an external laser or a UV light sources.

Photonic circuits offer advantages over electrical circuits like as lower power consumption, less heat generation, and the theoretic ability to achieve greater processing speeds and physically smaller circuits. These benefits may be especially important in newer classes of devices that require smaller, higher-performance, and more efficient processing capabilities, such as quantum computers and next-generation mobile or embedded devices.

Current efforts to exploit the advantages of photonic computing aim to integrate discrete optical circuits into electrical computer systems. This approach, however sacrifices some of the benefits of optical processing. For example, a hybrid optoelectronic device may waste a significant amount of power or reduce data-transmission speed every time it must translate information-carrying signals between electrical and photonic for ats.

An all-optical computer processor would overcome many of these problems, but there is currently no way to efficiently manufacture optical logic circuits in a manner capable of being scaled up to facilitate high-volume commercial manufacturing.

There is thus a need for a way to design and manufacture optical logic gates capable of being used as building blocks for more complex circuits like optical computer processors.

SUMMARY

An embodiment of the present invention provides a media-defined optical logic circuit capable of performing a logical operation, the circuit comprising:

a set of polyhedral prisms physically arranged such that at least one surface of each prism of the set of polyhedral prisms is adjacent to a distinct surface of another prism of the set of polyhedral prisms, where a first prism of the set of polyhedral prisms comprises a first embedded quantum dot of a set of quantum dots, a first prism-input surface, and a first prism-output surface, such that a sufficiently energetic first photonic signal received through the first prism-input surface is capable of exciting the quantum dot to produce light capable of being emitted through the first prism-output surface as a second photonic signal, where the first prism-output surface is adjacent to a second prism-input surface of a second prism of the set of polyhedral prisms, such that light is capable of passing from the first prism to the second prism along a path between the first prism-output surface and the second prism-input surface, where the logic circuit is configured to respond to a set of photonic circuit-input signals, received from external light sources, by emitting a set of photonic circuit-output signals, where the set of photonic circuit-output signals represents a binary value derived by performing the logical operation upon a binary value represented by the set of photonic circuit-input signals, where the arrangement of the set of polyhedral prisms allows the circuit to receive the set of photonic circuit-input signals through input surfaces of one or more circuit-input prisms of the set of polyhedral prisms, and where the arrangement of the set of polyhedral prisms allows the circuit to emit the set of circuit-output signals through circuit-output surfaces of one or more circuit-output prisms of the set of polyhedral prisms.

Another embodiment of the present invention provides a method of forming an optical logic circuit, the method comprising:

physically arranging a set of polyhedral prisms such that at least one surface of each prism of the set of polyhedral prisms is adjacent to a surface of another prism of the set of polyhedral prisms, where a first prism of the set of polyhedral prisms comprises a first embedded quantum dot of a set of quantum dots, a first prism-input surface, and a first prism-output surface, such that a sufficiently energetic first photonic signal received through the first prism-input surface is capable of exciting the quantum dot to produce light capable of being emitted through the first prism-output surface as a second photonic signal, and where the first prism-output surface is adjacent to a second prism-input surface of a second prism of the set of polyhedral prisms, such that light is capable of passing from the first prism to the second prism along a path between the first prism-output surface and the second prism-input surface; and configuring the logic circuit to respond to a set of photonic circuit-input signals, received from external light sources, by emitting a set of photonic circuit-output signals, where the set of photonic circuit-output signals represents a binary value derived by performing a logical operation upon a binary value represented by the set of photonic circuit-input signals, where the arrangement of the set of polyhedral prisms allows the circuit to receive the set of photonic circuit-input signals through input surfaces of one or more circuit-input prisms of the set of polyhedral prisms, and where the arrangement of the set of polyhedral prisms allows the circuit to emit the set of circuit-output signals through circuit-output surfaces of one or more circuit-output prisms of the set of polyhedral prisms, Yet another embodiment of the present invention provides a method of using an optical logic circuit, the method comprising:

submitting to the optical logic circuit, by means of external light sources, a set of photonic circuit-input signals, where the optical logic circuit comprises a set of polyhedral prisms physically arranged such that at least one surface of each prism of the set of polyhedral prisms is adjacent to a surface of another prism of the set of polyhedral prisms, where a first prism of the set of polyhedral prisms comprises a first embedded quantum dot of a set of quantum dots, a first prism-input surface, and a first prism-output surface, such that a sufficiently energetic first photonic signal received through the first prism-input surface is capable of exciting the quantum dot to produce light capable of being emitted through the first prism-output surface as a second photonic signal, and where the first prism-output surface is adjacent to a second prism-input surface of a second prism of the set of polyhedral prisms, such that light is capable of passing from the first prism to the second prism along a path between the first prism-output surface and the second prism-input surface, where the logic circuit is configured to respond to the set of photonic circuit-input signals by emitting a set of photonic circuit-output signals that represents a binary value derived by performing a logical operation upon a binary value represented by the set of photonic circuit-input signals, where the arrangement of the set of polyhedral prisms allows the circuit to receive the set of photonic circuit-input signals through input surfaces of one or more circuit-input prisms of the set of polyhedral prisms, and where the arrangement of the set of polyhedral prisms allows the circuit to emit the set of circuit-output signals through circuit-output surfaces of one or more circuit-output prisms of the set of polyhedral prisms; and reading the set of circuit-output signals emitted by the optical logic circuit in response to receiving the photonic circuit-input signals.

DETAILED DESCRIPTION

Embodiments of the present invention describe optical logic circuitry assembled from a set of polyhedral "crystals" or prisms that contain quantum dots, and a method of manufacturing such a circuit.

As is known in the art, a quantum dot (also referred to in this document as a "QD") is a nanoscale "semiconductor" particle so small that its optical and electronic properties are subject to quantum mechanical effects.

Quantum dots emit light at certain frequencies in response to being excited by a sufficiently energetic electrical or photonic signal. It is possible to control which frequencies of light may be emitted by a particular QD by specifying the dot's size, shape, or material of composition.

Figure 2:
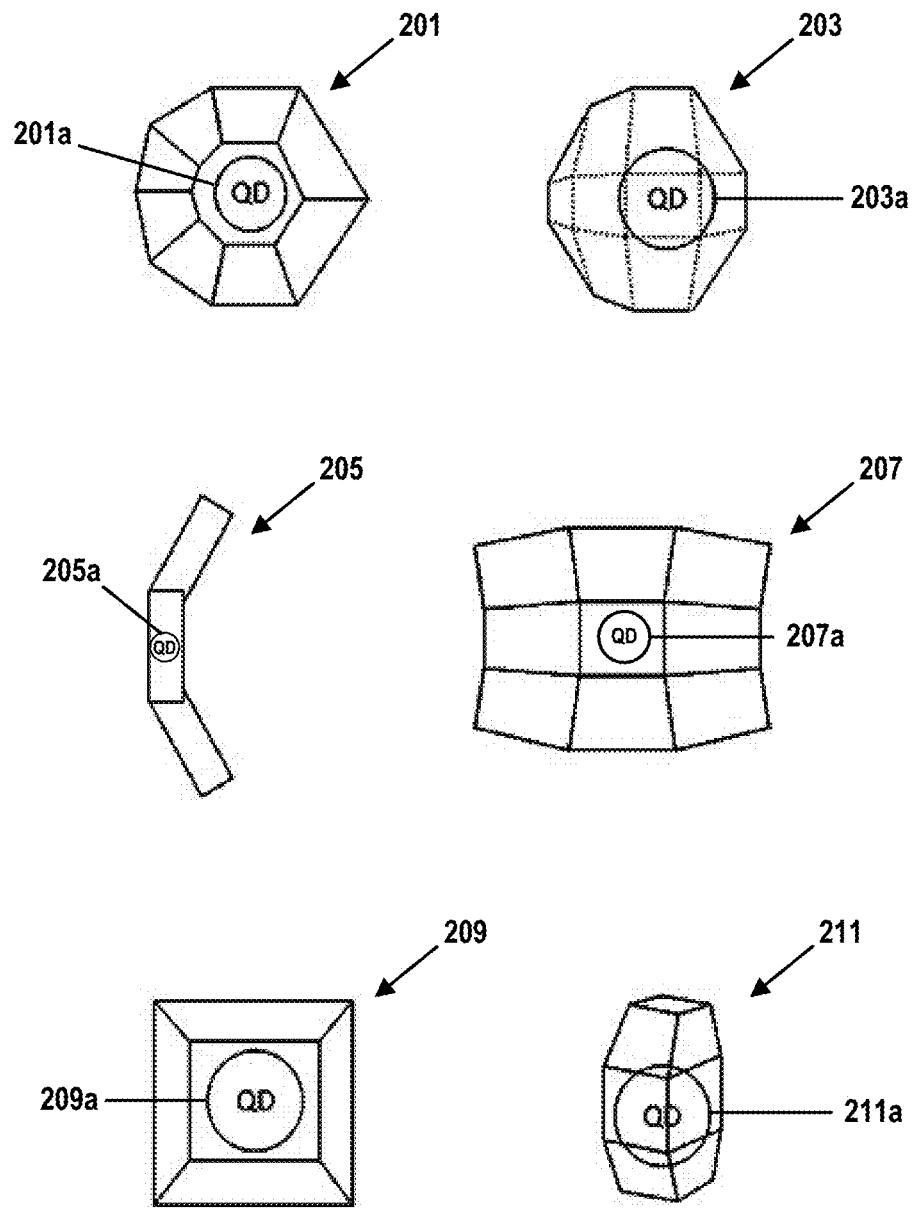
FIG. 2 shows examples of prismatic crystals that may be incorporated into embodiments of the present invention.

One or more quantum dots may, through means known in the art, be embedded into a polyhedral prism or crystal capable of passing light. The prism or crystal may be generated in a specific desired shape and with a specific number of surfaces by controlling conditions under which the prism or crystal is created or grown. These conditions may include the chemical composition of the prism or crystal or the temperature at which it is created. Examples of common polyhedral prism shapes are shown in FIG. 2.

Methods of embedding quantum dots into polyhedra light-passing prisms are known in the art and more are in development. These methods include high-temperature dual injection fabrication, which can produce various dot sizes and chemical compositions and are sufficiently scalable to accommodate large commercial applications that require hundreds of tons of quantum dots.

Large volumes of QDs may also be produced by processes that synthesize technical continuous-flow systems by methods analogous to hot-injection technologies, and by molecular-seeding methodologies that do not need a high-temperature injection step, but instead control particle size by seeding nanoparticle-growth sites of a molecular-cluster compound at moderate temperatures. Other QD-fabrication technologies are based on supercooled silicon CMOS semiconductors, on electromechanical technologies that use templates to spawn self-assembling QD-based nanostructures, and on core-shell structures into which a region of one material in embedded into a second material.

Self-assembling quantum-dot structures may also be defined by arrays of lithographically patterned electrodes, or by a method of growing QDs known in the art as Stranski-Krastanov growth. Genetically engineered biomanufacturing viruses and bacteria have also been used to generate inorganic nanocrystals capable of producing self-assembling quantum-dot nanostructures.

Embodiments of the present invention are flexible enough to accommodate any known or future method of generating quantum dots or of embedding QDs into a crystal or non-crystalline polyhedral prism capable of receiving external light through one or more light-transmitting surfaces. When an external electrical or photonic stimulus of appropriate intensity, duration, or frequency reaches the embedded QD, the QD responds by emitting light at a specific frequency and intensity. The prism then emits, through another surface, the light generated by the embedded QD.

Figure 1:
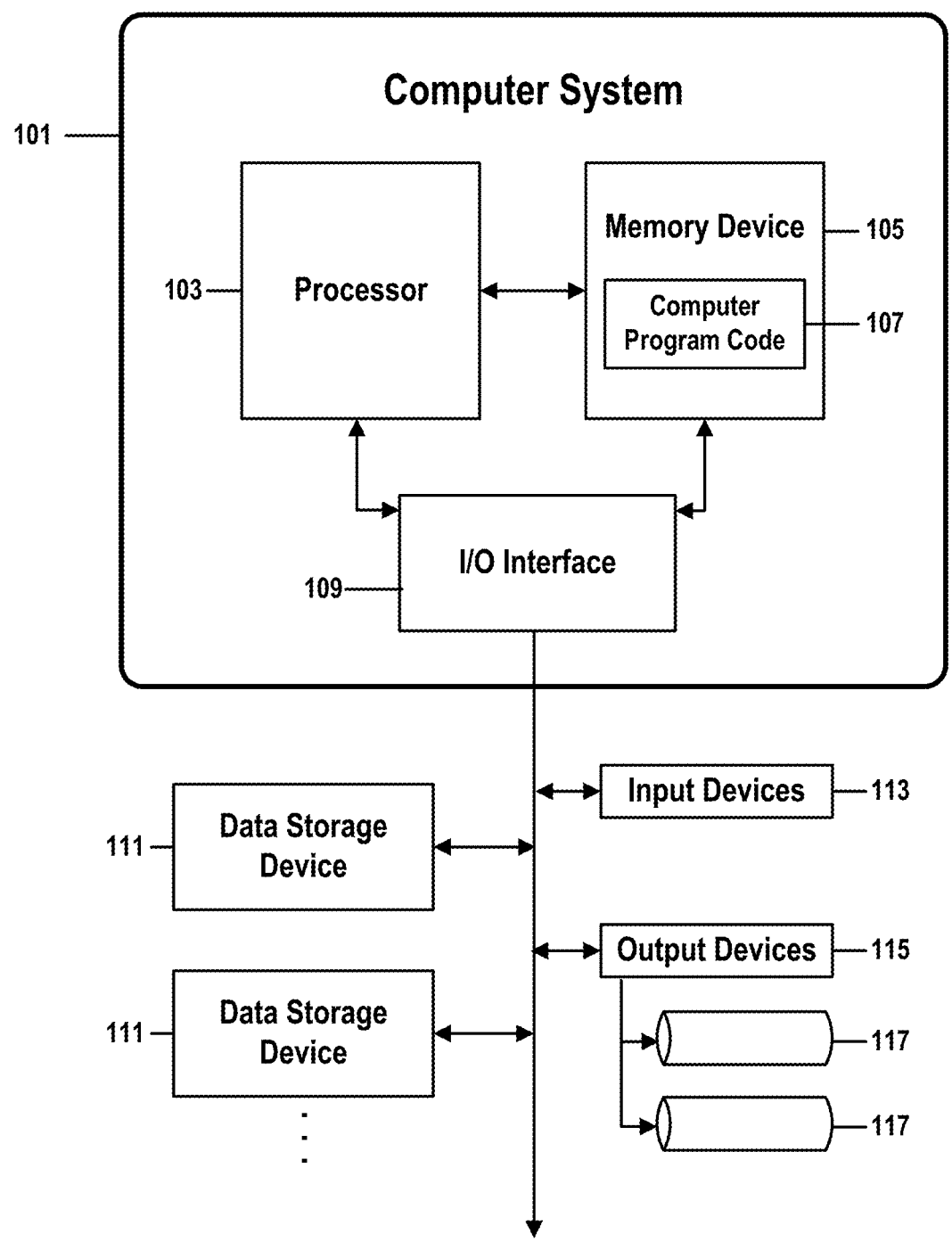
FIG. 1 shows the structure of a computer system and computer program code that may be used to implement a method for designing media-defined optical logic circuitry design in accordance with embodiments of the present invention.
Figure 3:
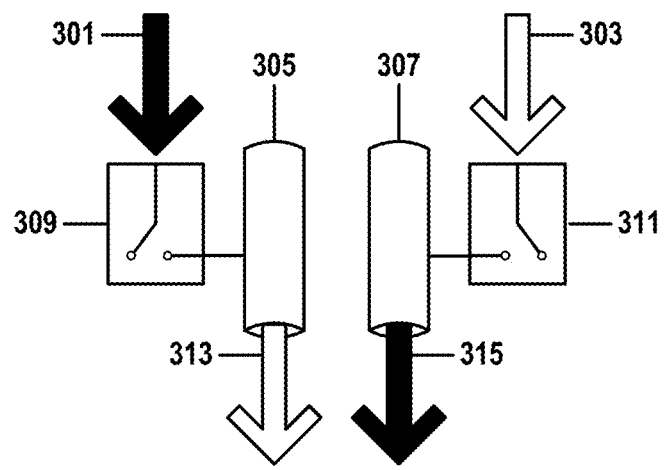
FIG. 3 illustrates an optical NOT logic gate formed in accordance with embodiments of the present invention.

One example of quantum-dot/crystal technology is described in pars. [0005]-[0011] and [0020]-[0029], and FIGS. 1-3, of the commonly-owned, co-pending United States Patent Application filed on Oct. 31, 2016, the contents and disclosure of which is expressly incorporated by reference herein in their entirety: U.S. patent application Ser. No. 15/339,902 for "OPTICAL STORAGE DEVICE UTILIZING QUANTUM SILOS." This co-pending application describes optical "silos" that store binary data by means of quantum dots embedded into stacks of crystals.

Embodiments of the present invention extend this technology by shading (rendering opaque or semi-opaque) certain of a prism's surfaces. This technique may be used to create a light-transmitting path, or waveguide, capable of routing light through the crystal between specific pairs of shaded surfaces. By arranging prisms such that a photonic output of a first prism becomes an input of a second, adjacent, prism, it is thus possible to route information-carrying photonic signals through a specific, deterministic path.

One or more surfaces of such a crystal may be completely shaded, preventing light from passing through the shaded surfaces, or may be partially shaded to merely attenuate light passing through the partially shaded surfaces.

Such prismatic crystals may be organized into more complex nanostructures. In such structures, a light path between two crystals may be created by physically arranging the crystals so that light emitted from a surface of one crystal can be received at a surface of the second crystal. In this manner, basic logic circuits, such as AND, OR, or XOR gates, may be constructed. These basic circuits may in turn be combined, as would logic circuits based on any other type of technology, to form more complex circuits, or even entire microprocessors.

For example, a three-sided crystal with two 50%-shaded surfaces and one unshaded surface may contain a QD capable of being excited by an external 100%-intensity photonic signal. Each of the shaded surfaces is positioned to receive light output from another prism capable of transmitting a 100%-intensity photonic signal. Because the semi-shaded surfaces reduce the intensity of incoming light by 50%, the three-sided crystal will receive 100%-intensity photonic input only if both shaded surfaces receive an external signal simultaneously. Therefore, the embedded QD will emit a 100%-intensity signal only if the three-sided crystal receives two 100%-intensity signals.

If a 100%-intensity photonic signal is deemed to represent a logical 1 and 0% intensity deemed to represent a logical 0, the three-sided crystal thus performs a rudimentary logical AND function, producing an output=1 only when receiving two inputs both equal to 1.

Similarly, a completely unshaded three-sided crystal might theoretically implement a rudimentary version of a logical OR function. In this case, a 100%-intensity photonic signal was received through either unshaded input surface would be sufficient to excite the embedded QD to produce a 100%-intensity logical 1 output.

Embodiments of the present invention implement this inventive concept in order to generate optical logic circuits where photonic signals are generated by quantum dots embedded into crystal prisms, and where the shape, geometry, number of surfaces, and shading of each prism, and the two-dimensional or three-dimensional organization of the prisms, defines binary logic operations performed by the optical circuit.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 shows a structure of a computer system and computer program code that may be used to implement a method for media-defined optical logic circuitry design in accordance with embodiments of the present invention. FIG. 1 refers to objects 101-117.

In FIG. 1, computer system 101 comprises a processor 103 coupled through one or more I/O Interfaces 109 to one or more hardware data storage devices 111 and one or more I/O devices 113 and 115.

Hardware data storage devices 111 may include, but are not limited to, magnetic tape drives, fixed or removable hard disks, optical discs, storage-equipped mobile devices, and solid-state random-access or read-only storage devices. I/O devices may comprise, but are not limited to: input devices 113, such as keyboards, scanners, handheld telecommunications devices, touch-sensitive displays, tablets, biometric readers, joysticks, trackballs, or computer mice; and output devices 115, which may comprise, but are not limited to printers, plotters, tablets, mobile telephones, displays, or sound-producing devices.

In embodiments of the present invention two or more of the output devices 115 may be lasers 117. These lasers 117 may be used to operate, fabricate, or test the optical logic circuits shown in FIGS. 3-8C.

Data storage devices 111, input devices 113, and output devices 115 may be located either locally or at remote sites from which they are connected to I/O Interface 109 through a network interface.

Processor 103 may also be connected to one or more memory devices 105, which may include, but are not limited to, Dynamic RAM (DRAM), Static RAM (SRAM), Programmable Read-Only Memory (PROM), Field-Programmable Gate Arrays (FPGA), Secure Digital memory cards, SIM cards, or other types of memory devices.

At least one memory device 105 contains stored computer program code 107, which is a computer program that comprises computer-executable instructions. The stored computer program code includes a program that implements a method for media-defined optical logic circuitry design in accordance with embodiments of the present invention, and may implement other embodiments described in this specification, including the methods illustrated in FIGS. 1-9. The data storage devices 111 may store the computer program code 107. Computer program code 107 stored in the storage devices 111 is configured to be executed by processor 103 via the memory devices 105. Processor 103 executes the stored computer program code 107.

In some embodiments, rather than being stored and accessed from a hard drive, optical disc or other writeable, rewriteable, or removable hardware data-storage device 111, stored computer program code 107 may be stored on a static, nonremovable, read-only storage medium such as a Read-Only Memory (ROM) device 105, or may be accessed by processor 103 directly from such a static, nonremovable, read-only medium 105. Similarly, in some embodiments, stored computer program code 107 may be stored as computer-readable firmware 105, or may be accessed by processor 103 directly from such firmware 105, rather than from a more dynamic or removable hardware data-storage device 111, such as a hard drive or optical disc.

Thus the present invention discloses a process for supporting computer infrastructure, integrating, hosting, maintaining, and deploying computer-readable code into the computer system 101, wherein the code in combination with the computer system 101 is capable of performing a method for media-defined optical logic circuitry design, Any of the components of the present invention could be created, integrated, hosted, maintained, deployed, managed, serviced, supported, etc. by a service provider who offers to facilitate a method for media-defined optical logic circuitry design. Thus the present invention discloses a process for deploying or integrating computing infrastructure, comprising integrating computer-readable code into the computer system 101, wherein the code in combination with the computer system 101 is capable of performing a method for media-defined optical logic circuitry design.

One or more data storage units 111 (or one or more additional memory devices not shown in FIG. 1) may be used as a computer-readable hardware storage device having a computer-readable program embodied therein and/or having other data stored therein, wherein the computer-readable program comprises stored computer program code 107. Generally, a computer program product (or, alternatively, an article of manufacture) of computer system 101 may comprise the computer-readable hardware storage device.

While it is understood that program code 107 for a method for media-defined optical logic circuitry design may be deployed by manually loading the program code 107 directly into client, server, and proxy computers (not shown) by loading the program code 107 into a computer-readable storage medium (e.g., computer data storage device 111), program code 107 may also be automatically or semi-automatically deployed into computer system 101 by sending program code 107 to a central (e.g., computer system 101) or to a group of central servers. Program code 107 may then be downloaded into client computers (not shown) that will execute program code 107.

Alternatively, program code 107 may be sent directly to the client computer mail. Program code 107 may then either be detached to a directory on the client computer or loaded into a directory on the client computer by an e-mail option that selects a program that detaches program code 107 into the directory.

Another alternative is to send program code 107 directly to a directory on the client computer hard drive. If proxy servers are configured, the process selects the proxy server code, determines on which computers to place the proxy servers' code, transmits the proxy server code, and then installs the proxy server code on the proxy computer. Program code 107 is then transmitted to the proxy server and stored on the proxy server.

In one embodiment, program code 107 for a method for media-defined optical logic circuitry design is integrated into a client, server and network environment by providing for program code 107 to coexist with software applications (not shown), operating systems (not shown) and network operating systems software (not shown) and then installing program code 107 on the clients and servers in the environment where program code 107 will function.

The first step of the aforementioned integration of code included in program code 107 is to identify any software on the clients and servers, including the network operating system (not shown), where program code 107 will be deployed that are required by program code 107 or that work in conjunction with program code 107. This identified software includes the network operating system, where the network operating system comprises software that enhances a basic operating system by adding networking features. Next, the software applications and version numbers are identified and compared to a list of software applications and correct version numbers that have been tested to work with program code 107. A software application that is missing or that does not match a correct version number is upgraded to the correct version.

A program instruction that passes parameters from program code 107 to a software application is checked to ensure that the instruction's parameter list matches a parameter list required by the program code 107. Conversely, a parameter passed by the software application to program code 107 is checked to ensure that the parameter matches a parameter required by program code 107. The client and server operating systems, including the network operating systems, are identified and compared to a list of operating systems, version numbers, and network software programs that have been tested to work with program code 107. An operating system, version number, or network software program that does not match an entry of the list of tested operating systems and version numbers is upgraded to the listed level on the client computers and upgraded to the listed level on the server computers.

After ensuring that the software, where program code 107 is to be deployed, is at a correct version level that has been tested to work with program code 107, the integration is completed by installing program code 107 on the clients and servers.

Embodiments of the present invention may be implemented as a method performed by a processor of a computer system, as a computer program product, as a computer system, or as a processor-performed process or service for supporting computer infrastructure.

FIG. 2 shows examples of prismatic crystals that may be incorporated into embodiments of the present invention. FIG. 2 shows elements identified by reference numbers 201-211a.

Each of the examples shown in FIG. 2 shows one view of a commonly shaped prism that may be used to implement optical logic circuits in compliance with embodiments of the present invention. These prisms 201, 203, 205, 207, 209, and 211 may be designed and created by any means known in the art, such as through methods of crystallography by which a crystal may be grown into a specific size and shape as a function of the crystal's elemental or chemical composition.

These prisms 201, 203, 205, 207, 209, and 211 each comprise at least one quantum dot 201a, 203a, 205a, 207a, 209a, or 211a (or "QD") embedded into a prism through means known in the art.

Elements 201 and 203, for example, show two views of a 26-sided "corner-cut cube" crystal shape, viewed, respectively from a top view and a side view. Elements 205 and 207 show, respectively, a side center-cut d a top view of a 30-sided "corner receiver" crystal shape. Elements 209 and 211 show, respectively, top and corner views of a 14-sided "central crystal" shape.

As described above, each surface of these crystals may be left unshaded (rendering it always capable of transmitting light), may be partially shaded (allowing the surface to pass only a portion of a light signal, or completely shaded (rendering the surface opaque).

The QD quantum dot encased in each of these crystals is capable of being excited by an external light source, such as a laser, if the crystal's surface shading creates a path through which the external source may reach the QD. When excited, the QD may emit light of a specific intensity and frequency, which may then be emitted from an unshaded surface of the crystalline prism. In other words, the prism, when properly shaded, may act as a waveguide.

The examples of FIG. 2 should not be construed to limit embodiments of the present invention to the prismatic shapes shown. Embodiments of the present invention are flexible enough to accommodate any shape prism capable of being created and deemed necessary by an implementer in order to implement a specific desired logical operation.

FIG. 3 illustrates an optical NOT logic gate formed in accordance with embodiments of the present invention. FIG. 3 comprises elements 301-315.

FIG. 3 shows a simple embodiment of the present invention that implements a media-defined optical processor designed to perform a logical NOT or inversion operation. Although not comprising prisms or quantum dots, this example is included here to provide context for the more complex implementations of FIGS. 4-8C.

Items 301 and 303 represent switchable external sources of light. Embodiments and examples described in this document refer to these sources as "lasers," but other embodiments may comprise any type of light sources known in the art. By convention, these external sources of light will be represented as a white arrow to indicate a source that is fully switched ON, and as a black arrow to indicate a light source that is switched OFF.

In embodiments that implement binary logic circuits, these ON and OFF states may indicate a laser that is either emitting light at full power (100%) or is not emitting any light (0%). But in some implementations, more than two states may be possible, or ON and OFF states may be represented by other light levels. Some implementations may, for example, comprise quantum dots capable of responding to light levels lower than 100%, allowing power savings by using external light sources at intensities less than 100%. In circuits that implement negative logic, a ON state may be indicated by a lower light intensity than would be an OFF state.

In FIG. 3, black-arrow item 301 thus represents a first input light source A that is currently in an OFF or 0 state. Similarly, white-arrow item 303 represents a second input light source B that is currently in an ON or 1 state.

External light source 301 controls a laser 305 by means of a light-activated switch 309. In FIG. 2, switch 309 is shown as a conventional SPST switch or relay, but in other embodiments, other types of switches and more complex switching topologies may be used. Embodiments of the present invention may comprise light-activated switches known in the art (such as liquid-crystal light valve (LCLV) switches) that are opened by an activating light signal, or may comprise light-activated switches that are closed by an activating light signal. In the example of FIG. 2, switches 309 and 311 are by default closed (thus switching on a corresponding laser 305 or 307), but may be opened by a higher-intensity light source.

This dual light-source arrangement is a most general case, in which light source 301 may be an incoming logical bit stream. As mentioned above, this external source 301 may be a laser triggered by an external condition or it may be any other type of light source capable of triggering light-activated switch 309. Similarly, laser 305 may be a laser, but it may also be any other type of light source capable of producing energy of a type capable of exciting a quantum dot embedded into a prism.

In a simple implementation, this mechanism may be collapsed into a single switchable light-source. In such cases, light source 301 might, for example, comprise a switchable laser that is controlled by external conditions, such as a user control, a manual switch, output received from another electrical or photonic circuit, or a laboratory condition that is extrinsic to the present invention. However, examples and embodiments described in this document will, for illustrative purposes, describe the more general mechanism shown here.

Light source 305 emits light 313 when laser 305 is switched on. Similarly, external light source 303 controls light-activated switch 311, which in turn switches laser 307 on or off. When switched on, laser 307 emits light 315.

This mechanism may implement logic tables for a pair of conventional NOT gates:

TABLE 1A

| A | Y |
|---|---|
| 0 | 1 |
| 1 | 0 |

TABLE 1B

| B | Y |
|---|---|
| 0 | 1 |
| 1 | 0 |

In FIG. 2, input A 301 is shown to be in an OFF or 0 state. Light-activated switch 309, w inch, in these examples, assumes an open condition when detecting an external light source is in its default closed state because input A 301 is 0. The closed switch allows laser 305 to emit high-energy light 313, producing an ON or 1 condition 313.

Similarly, input B 303 is shown to be in an ON or 1 state. This signal opens light-activated switch 311, which interrupts light emitted by laser 307 (or diverts or turns off laser 307), producing an OFF or 0 condition 315.

Figure 4:
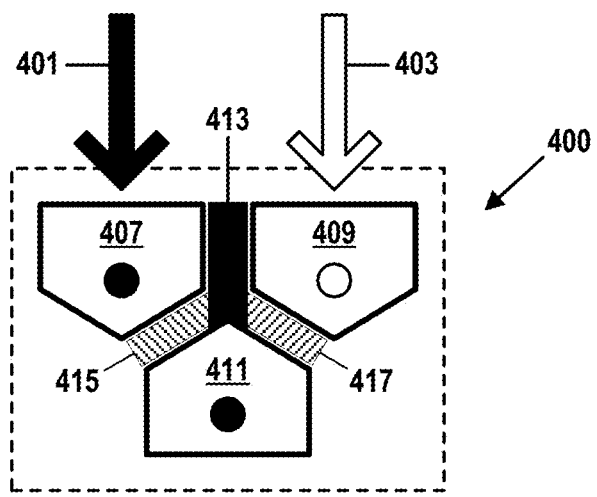
FIG. 4 illustrates an optical AND logic gate formed in accordance with embodiments of the present invention.

FIG. 4 illustrates an optical AND logic gate formed in accordance with embodiments of the present invention. FIG. 4 comprises elements 401-415.

The optical circuit shown in FIG. 4 is a two-input AND gate. As in FIG. 3, inputs A 401 and B 402 are external light sources, similar to those identified by items 301, 303, 313, or 315 in FIG. 3.

Item 400 is an optical circuit that implements the AND logic by means of three shaded prisms 407, 409, and 411, each of which comprises a quantum dot capable of being excited by a light signal of sufficient intensity or frequency. Each surface of these prisms may be fully or partially shaded in order to create conditional waveguides capable of directing light between the prisms.

Prismatic optical circuit 405 has two inputs A and. B that equate, respectively, to the unshaded top surfaces of prism 407 and 409. Circuit 400's output Y is emitted from the bottom surface of prism 411. Other examples in FIGS. 5-8C will use similar conventions to indicate input and output surfaces of prism-based optical circuits.

The surfaces between prisms 407 and 409 are, for example, 100% shaded by shading 413. This prevents light being transferred between prism 407 and prism 409. For example, light that has entered prism 407 from an external source, or that has been generated by a quantum dot embedded into prism 407 cannot enter prism 409 or excite the quantum dot embedded into prism 409. This 100% shading creates an unconditional waveguide that prevents input signals 401 and 403 from being mixed at the input to the optical circuit 400.

TABLE 2

| A | B | Y |
|---|---|---|
| 0 | 0 | 0 |
| 0 | 1 | 0 |
| 1 | 0 | 0 |
| 1 | 0 | 1 |

In the example of FIG. 4, input A 401 is 0 (indicated by the incoming black arrow) and input B 403 is 1 (indicated by the white arrow). Input A enters the optical circuit 405 through the upper surface of prism 407, and input B enters through the upper surface of prism 409. 100% shading 413 prevents these optical inputs from bleeding between prisms 407 and 409. The output of the logical circuit 405 is emitted from the bottom surface of prism 411.

Prism 411 is partially isolated from prisms 407 and 409 by 50% shading 417 and 415. If the quantum dot embedded in prism 411 can only be excited by a light level equal to a 100% laser output, then light guided into prism 411 from only prism 407 or from only prism 409 is insufficient to excite the QD, and thus insufficient to output a 1 signal from the bottom surface of prism 411.

FIG. 4 shows a logic state similar to the second row of Table 2, with input A 401=0 and input B 403=1. As can be seen in the figure, the 0% intensity level of input A 401 fails to excite the quantum dot embedded in prism 407, resulting in no light passing through the shaded surface 417 of prism 411. The 100% intensity level of input B 401 does, however, excite the quantum dot embedded in prism 407, resulting in a 50% light level passing through the 50% shaded surface 417 of prism 411. 50% intensity, however, is insufficient to excite the QD embedded in prism 411, resulting in a 0 output.

Although not shown in the figure, if both input A 401 and input B 403 were set equal to 1, optical circuit 405 would emit a 100% light level, producing a logical 1 output.

In this case, the two 100% inputs would each excite one of the QDs embedded into prisms 407 and 409. These excitations would each emit a 100% light signal, each of which is attenuated by shading 415 or 417 such that two 50%-intensity signals enter prism 411. These two signals add up to a 100% signal, sufficient enough to excite the QD embedded in prism 411. That excited QD emits a 100%-intensity light signal, which is emitted from the output of circuit 405 through the bottom surface of prism 411, as a logical 1 signal.

Figure 5:
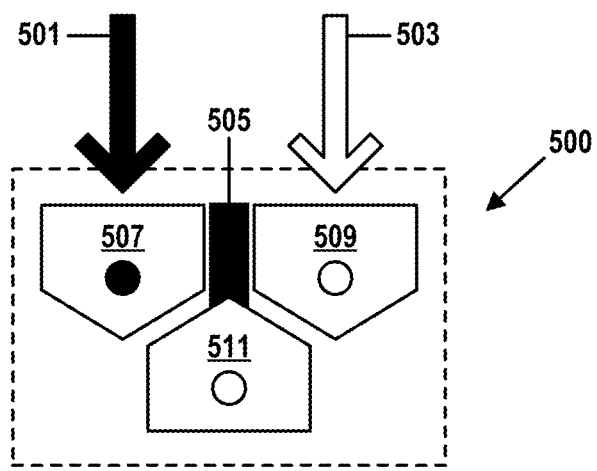
FIG. 5 illustrates an optical OR logic gate formed in accordance with embodiments of the present invention.

FIG. 5 illustrates an optical OR logic gate formed in accordance with embodiments of the present invention. FIG. 5 comprises elements 500-511.

Here, optical OR circuit 500 comprises three: prisms 507, 509, and 511, each of which contains an embedded QD capable of emitting a light signal of a particular frequency and intensity when excited by an external light source. As in previous figures, the circuit 500 receives an optical input signals A 501 and B 503 respectively through the unshaded upper surfaces of prisms 507 and 509 and emits an optical output signal through the unshaded bottom surface of prism 511. As in FIG. 4, the common surfaces shared by prisms 507 and 509 are shaded 100%, preventing input signals from bleeding between prisms 507 and 509. There is not shading between output prism 511 and either input prism 507 or 509.

TABLE 3

| A | B | Y |
|---|---|---|
| 0 | 0 | 0 |
| 0 | 1 | 1 |
| 1 | 0 | 1 |
| 1 | 1 | 1 |

FIG. 5 illustrates the second logic state listed in the OR logic illustrated by Table 3. Here, input A 501 assumes a 0 state, which fails to excite the QD embedded in prism 507. Thus no light is transmitted from prism 507 to output prism 511. Input B 503, however assumes a 1 state, which does excite the QD embedded in prism 507, causing the QD to emit a 100%-intensity light signal that passes through the unshaded adjacent surfaces of prisms 509 and 511. Thus a 100% light signal is transmitted from prism 507 to output prism 511, resulting in an output state of Y=1. Similar results would occur if input A 501 was set to 1 and input B 503 was set to 0.

If both inputs A 501 and B 503 are set 1, then two 100% light signals pass from prisms 507 and 509 to output prism 511. That aggregated light level is sufficient to excite the QD embedded into prism 511, thus producing an output signal Y=4. Conversely, if both inputs A 501 and B 503 are set to 0, then no light enters prisms 507 or 509, the QDs embedded in prisms 507 and 509 are not excited to produce light, and no light is transmitted to output prism 511. Thus output prism 511 produces no output, resulting in an Output signal Y=0.

Figure 6:
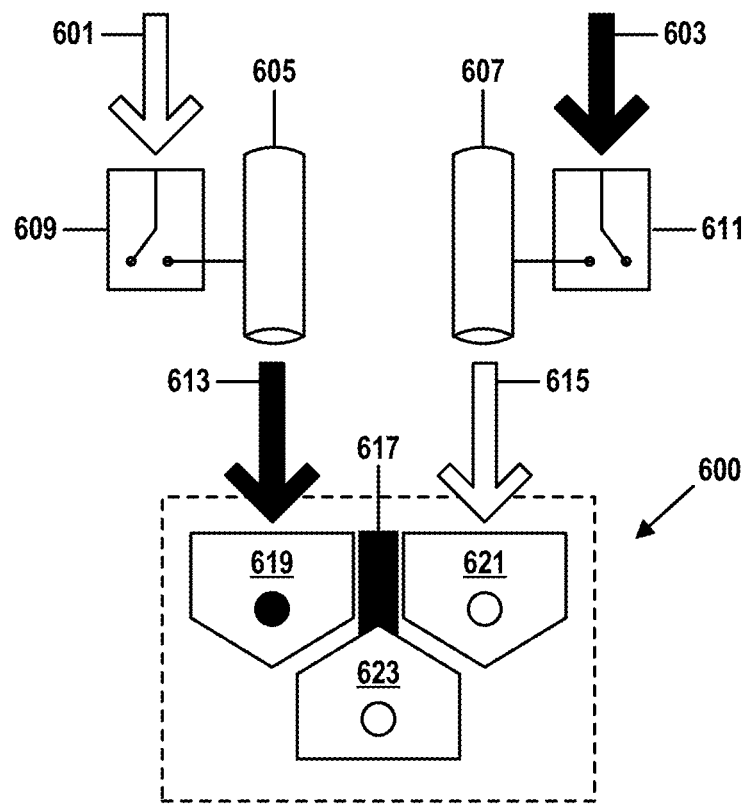
FIG. 6 illustrates an optical NAND logic gate formed in accordance with embodiments of the present invention.

FIG. 6 illustrates an optical NAND logic gate formed in accordance with embodiments of the present invention. FIG. 6 comprises elements 600-623.

FIG. 6 shows an embodiment that combines the input-switching function of FIG. 3 with the prism-based optical circuitry 600 similar to that of the optical OR gate of FIG. 5. The resulting circuitry implements the NAND logic shown in Table 4. Another way to think about the implementation of FIG. 6 is as a combination of the NOT gate of FIG. 3 with the OR gate of FIG. 5. As is known in the field of binary logic, inverting an OR function produces a NAND function, so in FIG. 6, sequentially combining optical NOT and OR functions correctly produces an expected NAND output. As with other binary logic technologies, embodiments of the present invention may similarly be scaled up to produce enormously complex logic functions in a similar manner, by combining more primitive logic functions.

TABLE 4

| A | B | Y |
|---|---|---|
| 0 | 0 | 1 |
| 0 | 1 | 1 |
| 1 | 0 | 1 |
| 1 | 1 | 0 |

FIG. 6 illustrates one state of the NAND logic shown in Table 4. Here, an input signal A 601 is set to 1, or 100% light intensity, and input signal B 603 is set to 0, or 0% light intensity. As discussed in FIG. 3, the 1 input 601 activates switch 609 to interrupt laser 605. Thus a 0%-intensity logical 0 signal 613 is received by the upper surface of prism 619.

Similarly, the 0 input 603 leaves switch 611 in its default closed state, thus allowing laser 607 to transmit a 100%-intensity signal 615 to the upper surface of prism 621. As described in previous figures, common surfaces of prisms 619 and 621 are shaded 100% to prevent incoming light from bleeding between prisms 619 and 621.

In this example, prism 619's QD is not excited, so no light is transmitted through the unshaded prism surface common to prisms 619 and 623. However, prism 621's QD is excited by laser 607's output 615, thus emitting light that passes through unshaded surfaces into output prism 623. This 100% light is sufficient to excite the QD embedded in prism 623, resulting in a logical 1 output signal being emitted from the bottom surface of output prism 623.

Other states defined by NAND logic Table 4 are implemented in a similar way by the circuitry of FIG. 6.

Figure 7B:
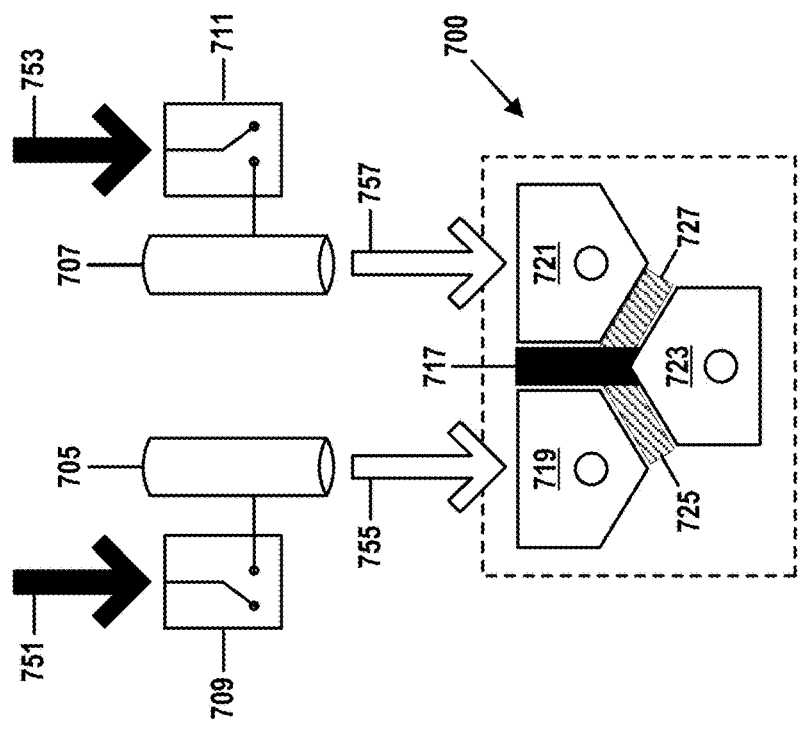
FIG. 7B illustrates a second state of an optical NOR logic gate formed in accordance with embodiments of the present invention.
Figure 7A:
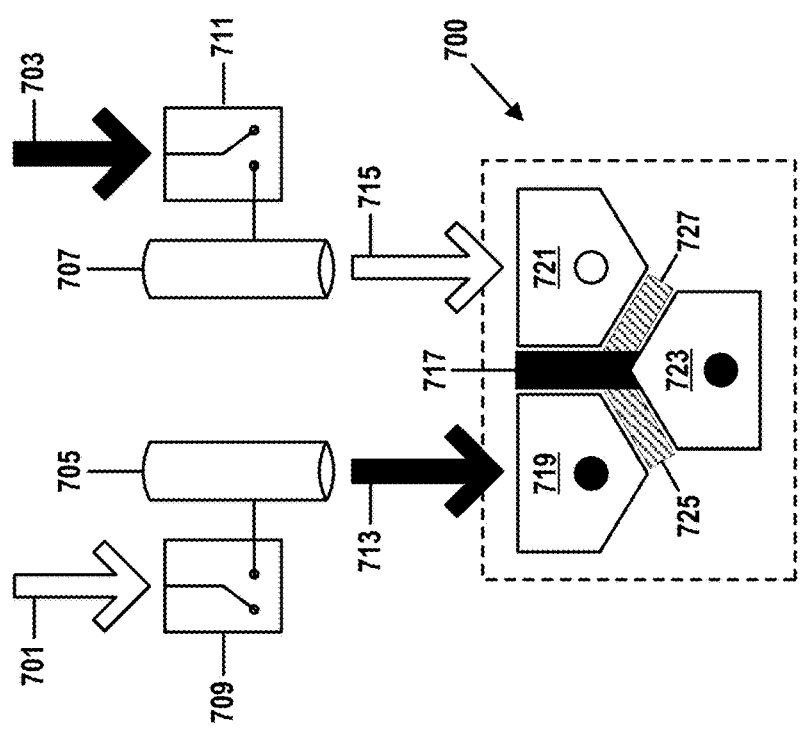
FIG. 7A illustrates a first state of an optical NOR logic gate formed in accordance with embodiments of the present invention.

FIG. 7A illustrates a first state of an optical NOR logic gate formed in accordance with embodiments of the present invention. FIG. 7A comprises elements 700-727.

As in FIG. 6, FIG. 7A builds a logic function by cascading a sequence of primitives. As is known in the art, a NOR function may be decomposed into a NOT function and an AND function. Accordingly, FIG. 7a implements a NOR function as a sequence of a NOT light-switching function (similar to that of FIG. 3) with an AND gate 700, as implemented in FIG. 4, item 400. Table 5 tabulates the logic states of a NOR gate.

TABLE 5

| A | B | Y |
|---|---|---|
| 0 | 0 | 1 |
| 0 | 1 | 0 |

TABLE 5-continued

| A | B | Y |
|---|---|---|
| 1 | 0 | 0 |
| 1 | 0 | 0 |

The upper part of FIG. 7A, comprising items 701-715, are identical in form and function to analogous elements of FIG. 3. Inputs A 701 and B 703 comprise light signals capable of switching light-activated switches 707 and 709, which permit or interrupt light signals 713 and 715 from lasers 705 and 707. Because of the configuration of switches 709 and 711, outputs 713 and 715 of this mechanism are inversions of the states of each input signal 701 and 703. Items 701-715 thus act as an inverter or NOT gate.

Optical AND circuit 700 comprises elements 717-727, which are identical in form and function to analogous elements of FIG. 4.

As in previous examples, input prisms 719 and 721 are isolated from each other by 100% shading applied to their common surfaces. Similarly, as in FIG. 4, 50% shading 725 and 727 is applied to common surfaces between prisms 719 and 723, and to the common surfaces between prisms 721 and 723. This 50% shading is capable of decreasing the intensity of light passing through those surfaces by 50%.

As is the case throughout embodiments and examples described in this document, this shading may be applied by any means known in the art, including etching, chemical treatment, dying, doping, or coating. Shading may be achieved by applying an opaque, translucent, refractive, reflective, or other type of coating known in the art and capable of limiting light transmission.

The example of FIG. 7A illustrates the second logic state enumerated in Table 5, where input A 701=1 (a 100% light-intensity level) and input B 703=0 (a 0% light-intensity level). The mechanism of elements 705-711 inverts these signals, producing a 0% light signal 713, which is transmitted to prism 719 through the unshaded upper surface of prism 719, and a 100%-intensity signal 715 that is transmitted to prism 721 through the unshaded upper surface of prism 721.

As a result, the QD of prism 719 is not excited and the QD of prism 721 is excited, producing a 100%-intensity light signal, which is attenuated to 50% intensity by shading 727. Output prism 723 thus receives only a 50%-intensity signal, which is less than the 100% intensity required to excite the QD embedded in prism 723. Circuit 700 thus produces no output, resulting in an output state Y=0.

The optical circuitry of FIG. 7A uses similar means to generate correct NOR output states when responding to other combinations of input states enumerated in Table 5. Another example of this procedure is described in FIG. 7B.

FIG. 7B illustrates a second state of an optical NOR logic gate formed in accordance with embodiments of the present invention. FIG. 7B comprises elements 700-727 and 751-757.

Items 700-727 are identical in form and function to analogously labeled items in FIG. 7A. FIG. 7B elaborates on the example of FIG. 7A by illustrating how the circuitry of FIGS. 7A and 7B conforms correctly to another logic state of a NOR function, which is the first state listed in Table 5:
0 NOR 0=1

In FIG. 7A, input A 751 and input B 753 are both set to 0, which corresponds to 0%-intensity light signals. These 0 signals do not open light-activated switches 709 and 711, allowing lasers 705 and 707 to transmit 100%-intensity logical 1 outputs 755 and 757 to prisms 719 and 721. These light signals pass unimpeded through the unshaded upper surfaces of prisms 719 and 721.

The QDs embedded in prisms 719 and 721 are each respectively excited by light sources 755 and 757. Prisms 719 and 721 thus emit 100%-intensity signals. These signals are each attenuated by 50% by the 50% shaders 725 and 727 that shade light passing between prism 723 and either prism 719 or 721.

Prism 723 thus receives two 50%-intensity signals that together have sufficient intensity to excite the QD of prism 723. A 100%-intensity output is thus emitted from the lower surface of prism 723 as output Y=1.

Figure 8A:
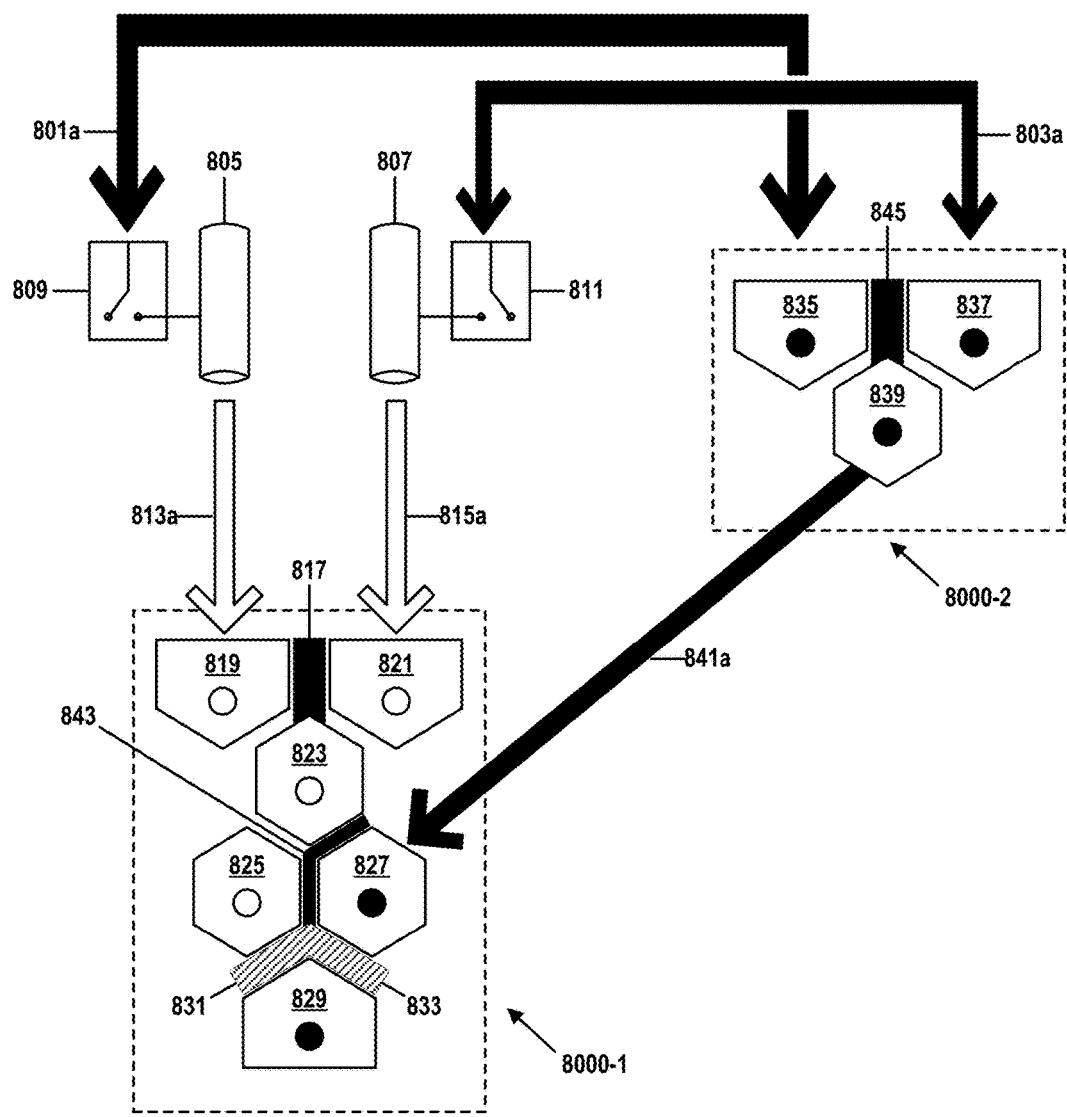
FIG. 8A illustrates a first state of an optical XOR logic gate formed in accordance with embodiments of the present invention.

FIG. 8A illustrates a first state of an optical XOR logic gate formed in accordance with embodiments of the present invention. FIG. 8A comprises elements 801a-845, 8000-1, and 8000-2.

The optical logic gate shown in this figure consists of three components that together implement the XOR logic enumerated in Table 6. In this example, these components are divided into two layers in order to better illustrate their operation. In other embodiments, an optical circuit created by means of the present invention may comprise many such layers of components.

FIG. 8A comprises:
i) a NOT inverter module 805-811 identical in form and operation to the NOT circuitry of FIG. 3;
ii) a more complex "Layer 1" optical-logic module 8000-1 that augments the pentagonal cross-section prisms shown in the preceding examples, with prisms 823-82.7 that each have a six-sided cross-section;
iii) and a "Layer 1" OR module 8000-2 similar in form and function to the OR circuitry of FIG. 5.

Figure 8B:
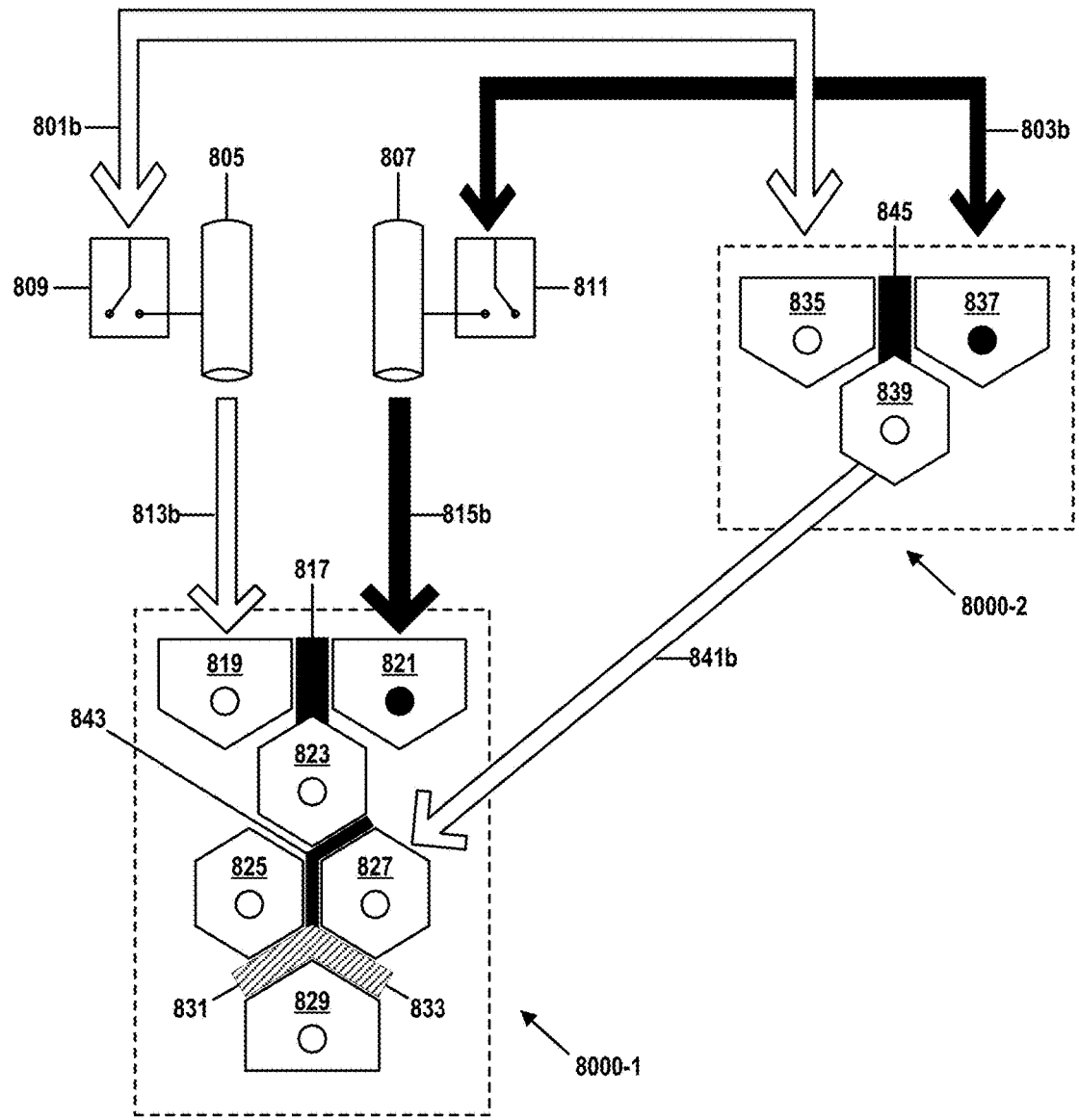
FIG. 8B illustrates a second state of an optical XOR logic gate formed in accordance with embodiments of the present invention.
Figure 8C:
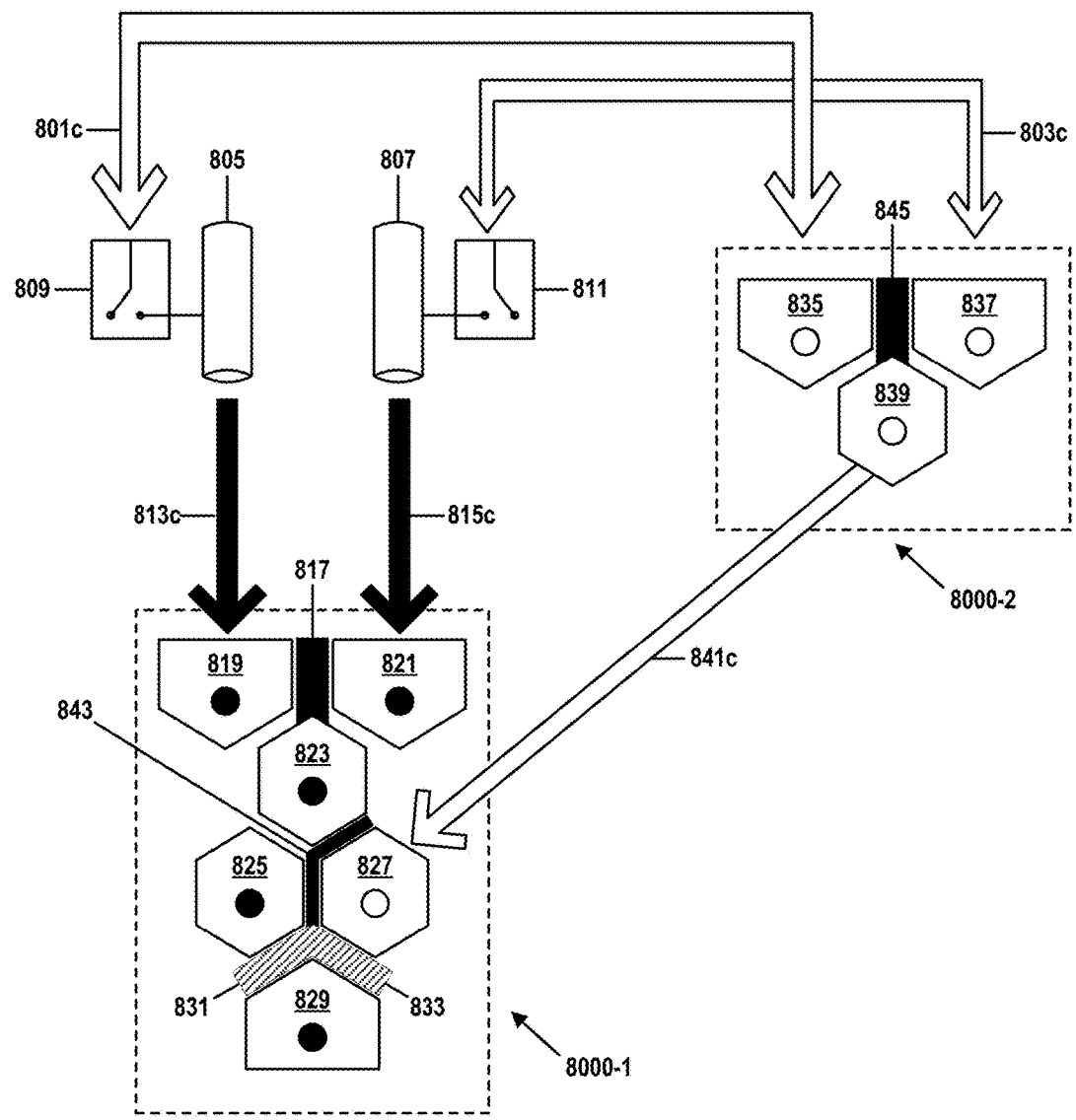
FIG. 8C illustrates a third state of an optical XOR logic gate formed in accordance with embodiments of the present invention.

Embodiments of the present invention are flexible enough to accommodate any sort of organization or logical partitioning of optical circuits. In the example of FIGS. 8A-8C, we organize components such that a Level 1 circuit has outputs and inputs that represent inputs and outputs of an overall logic table. Level 2 circuits perform subordinate functions required by the Level 1 circuit to produce output. Similarly, deeper-level circuits would each perform such a function for a next-higher level. This choice of organization methodology is selected for pedagogical purposes and should not be construed to be an essential element of the present invention.

As mentioned earlier, embodiments of the present invention may comprise prisms that have any sort of shape and have any umber of sides that are capable of being manufactured by processes known in the art. Shape, size, and surface configurations may be required in some implementations in order to physically fit prisms together in a manner that enables desired light guides to be created. Certain shapes may, for example, be required when implementing functions that require a prism to have a larger number of input surfaces.

Similarly, embodiments may comprise prisms that have different degrees of shading than are described in the examples and embodiments of the figures. Consider, for example, a prism that is intended to produce output only when receiving three simultaneous 100%-intensity signals. If the prism's QD can only be excited by a 100%-intensity signal, the three-way logic requirement may be met by applying 67% shading to each of three surfaces of the prism that are adjacent to prisms capable of emitting a 100%-intensity signal. Those shadings reduce each incoming signal to 33%-intensity, thus preventing the prism from receiving 100%-intensity light unless three incoming signals reach the prism's input surfaces.

In the circuitry of FIG. 8A, inputs A and B each have two entry points. Input A 801a is received both at the unshaded upper surface of prism 835 and at light-activated switch 809. Similarly, input B 803a is received both at the unshaded upper surface of prism 837 and at light-activated switch 811. In FIG. 8A, both inputs 801a and 803a are in a logical 0 state, with 0% intensity.

TABLE 6

| A | B | Y |
|---|---|---|
| 0 | 0 | 0 |
| 0 | 1 | 1 |
| 1 | 0 | 1 |
| 1 | 0 | 0 |

As in the NOT circuitry of FIG. 3, light-activated switches 809 and 811 are toggled by inputs A 801a and B 803a to control the emission of 100%-intensity light from lasers 805 and 807. Here, the two 0-level input signals result in two 100%-intensity laser beams being transmitted to prisms 819 and 821.

Prisms 819 and 821 are isolated from each other by 100% shading 817 in order to prevent light from bleeding between the two prisms. Similarly, prisms 835 and 837 are isolated from each other by 100% shading 845, and prism 827 is isolated by 100% shading 843 from prisms 823 and 825. Finally, prism 829 is partially isolated from prisms 825 and 827 by 50% shadings 831 and 833. Similar patterns of shading may be selected, as desired by an implementer, in order to create unconditional or conditional waveguides that route signals through the logic circuitry in a desired manner.

In the example of FIG. 8A, the QDs embedded into prisms 819 and 821 are both excited by 100% input signals 813a and 815a and each thus emit a light signal. These signals are transmitted to prism 823 through unshaded surfaces, and prism 823 in turn generates and transmits a 100% light signal to prism 825.

Inputs A 801a and B 803a are also fed directly into the upper "input" surfaces of prisms 835 and 837. Neither of these inputs (both at 0% intensity) is capable of exciting any of the quantum dots in the Level 2 module 8000-2.

Output prism 839 of Level 2 module 8000-2 transmits a light signal 841a to an input surface on prism 827 of Level 1 module 8000-1. The 0% signal 841a is insufficient to excite the quantum dot embedded into prism 827.

Level 1 output prism 829 implements AND-gate logic, much like the optical circuitry shown in FIG. 4. Prism 829 thus produces a logical 1 (100% intensity) signal only when both prisms 825 and 827 transmit similar logical 1 signals to prism 829 through the 50% shaders 831 and 833.

Here, prism 825 transmits a 1 signal to prism 829, but prism 827, having received a 0 signal from Level 2 module 8000-2, transmits a 0 signal to prism 829. Prism 829, therefore receives only a 50%-intensity input, insufficient to excite the QD embedded within prism 829. The XOR logic of FIG. 8A therefore correctly produces a 0 output Y through the bottom surface of output prism 829.

FIGS. 8B and 8C explain how the optical logic of FIG. 8A correctly produces other logic states enumerated in Table 6.

FIG. 8B illustrates a second state of an optical XOR logic gate formed in accordance with embodiments of the present invention. FIG. 8B comprises elements 801b-845, 8000-1, and 8000-2.

Elements 805-811, 817-833, 835-839, 843-845, 8000-1, and 8000-2 are identical in form and function to similarly numbered items in FIG. 8A. In this example, however Input A 801b is a 100%-intensity logical 1 light signal and Input B 803b is a 0%-intensity signal.

As described in previous examples, these inputs result in the transmission of a 100%-intensity light signal 8136 to prism 819 and the transmission of a 0%-intensity light signal 8156 to prism 821. The QD embedded in prism 819 responds by sending a 100%-intensity signal to prism 823, which then forward the signal to prism 825.

At Level 2 8000-2, signal A 801b and signal B 803b cause prism 839 to transmit a 100% signal to an unshaded input surface of prism 827 on Level 1 8000-1, Because QDs embedded with both prism 825 and prism 827 are excited, the two resulting 100%-intensity signals, even when attenuated by 50% shadings 831 and 833, are sufficient to excite the QD comprised by output prism 829.

Prism 829 thus correctly produces a 100%-intensity output Y=1.

If the states of input A 801b and B 803b were reversed, the optical circuitry of FIG. 8B would produce a similar output. This may be seen by noting the symmetry with respect to the two inputs that exists in all three components of FIGS. 8A-8C.

FIG. 8C illustrates a third state of an optical XOR logic gate formed in accordance with embodiments of the present invention. FIG. 8 comprises elements 801c-845, 8000-1, and 8000-2.

Elements 805-811, 817-833, 835-839, 843-845, 8000-1, and 8000-2 are identical in form and function to similarly numbered items in FIGS. 8A and 8B. In this example, both Input A 801c and Input B 803c are 100%-intensity signals equal to a logical value of 1.

By means described in previous examples, these inputs result in the transmission of a 0%-intensity light signals 813c and 815c to prisms 819 and 821 of Level 1 circuitry 8000-1. These 0%-intensity inputs fail to excite any quantum dots along the wave guide comprising prisms 819-825.

At Level 2 8000-2, signal A 801c and signal B 803c excite quantum dots in prisms 835 and 837, in turn exciting prism 839. Level 1 secondary-input Prism 827 thus receives a 100%-intensity signal 841c from Level 2's output prism 839.

Because the QD embedded in prism 825 has not been excited, only prism 827 transmits 100%-intensity light to output prism 829. Because this light is attenuated by 50% shading 833, the resulting 50%-intensity light is insufficient to excite the prism 829 quantum dot. Prism 829 thus correctly produces a 0%-intensity photonic output Y=0.

Figure 9:
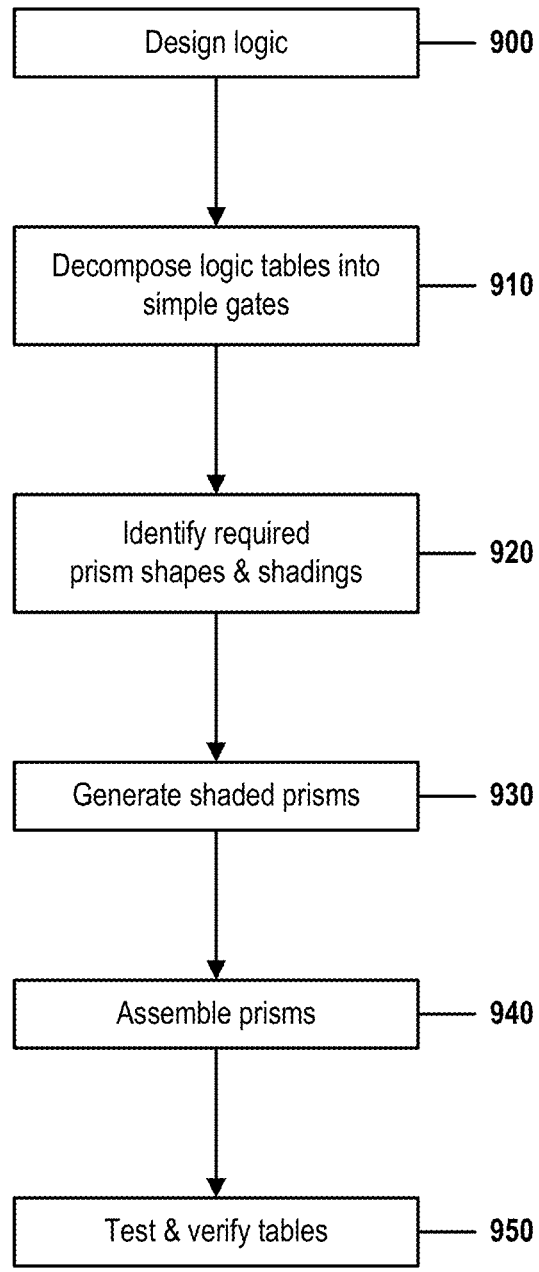
FIG. 9 is a flow chart that illustrates the steps of a method for media-defined optical logic circuitry design in accordance with embodiments of the present invention.

FIG. 9 is a flow chart that illustrates the steps of a method for media-defined optical logic circuitry design in accordance with embodiments of the present invention. FIG. 9 comprises steps 900-950.

In step 900, processor 103 of a computerized optical-logic design system receives one or more binary logic tables (or other known type of representation) of a set of binary-logic operations to be implemented as an optical logic circuit.

In step 910, the processor 103 decomposes the desired binary-logic operation into one or more sequences of simpler logical functions. These simpler circuits may comprise primitive binary logic functions like binary NOT, AND, OR, XOR, NAND, or NOR gates. In other embodiments, the simpler logical functions may comprise less-primitive functions, such as shift registers, that may be assembled from binary logic gates.

This step may be performed through any methods known in the art of logic design, and may be performed through completely automated means, in which processor 103 automatically designs low-level logic necessary to implement the desired binary-logic operations identified in step 900. In other embodiments, all or part of this step may be performed manually through known logic-design procedures, or by specialized software systems configured to design binary logic. In all cases, the design procedures implemented in this step may be similar to known methods of logic design applicable to circuits implemented through any sort of underlying technology or medium.

In step 920, the processor 103 translates the logical elements decomposed in step 910 into a set of optical circuits that each comprise one or more polyhedral prisms into which have been embedded quantum dots.

As described in FIGS. 3-8C, each prism may comprise one or more light-transmissive surfaces that each act as either an input or an output to the prism. One or more external input light signals may enter the prism through such an input surface and an output signal generated by an excited embedded QD may exit the prism as an output signal through one or more of the output surfaces.

Each surface of such a prism may be completely or partially shaded in order to prevent or attenuate an external photonic signal, similar to the way that an electrical signal of an electronic circuit may be attenuated or completely blocked by non-conductive or semi-conductive materials.

Many methods of shading surfaces are known in the art of molecular crystallography and in other fields related to, nanotech manufacturing. It is possible, for example, to selectively apply coatings or to alter the molecular makeup of specific surfaces in order to darken those surfaces or to give them reflective properties. In some cases, a shaded surface may be configured to be electrically or optically rewritable, allowing software-defined circuit upgrades to be applied to a circuit after-the-fact.

As explained in the examples of FIGS. 3-8C, shaded prism surfaces of such logical circuits can be organized into lightguides that route photonic signals through a set of prisms in configurations implement desired logic operations.

These prisms may be physically arranged into two-dimensional or three-dimensional structures such that an input surface of a first prism is positioned to receive a photonic signal emitted by an output surface of a second prism. In some embodiments, such a structure may comprise interconnected layers of two-dimensional "films" or "sheets," analogous to layers in an electrical integrated circuit. However, given the current state of the art of nanoscale-fabrication technologies, there is no requirement for such a limitation. And as such technologies continue to improve, increasingly complex three-dimensional structures will continue to become cost-effective.

A photonic logic circuit designed by the method of FIG. 9 may have an overall set of exterior input surfaces capable of receiving a set of input signals and an overall set of exterior output surfaces capable of emitting one or more output signals. If a row of the logic table received in step 900 identifies a pair of corresponding input and output states, the circuit will emit a set of photonic signals from the output surfaces that represent an output state produced in response to receiving, at the input surfaces, photonic inputs that represent the corresponding input state.

The processor may determine the arrangement of the prisms in any way known in the art of logic design, including methodologies analogous to those used when designing electrical logic circuits by assembling sets of logic gates.

For example, an electrical NAND function be implemented in electrical CMOS or TTL circuitry as by routing outputs of one or more inverting NOT gates to the inputs of an OR gate (or vice-versa). Although embodiments of the present invention implement logic by means of a fundamentally different technology, they nonetheless allow a photonic NAND function to be designed, at a logical level, by similarly cascading logical NOT and OR functions. One example of this is illustrated in FIG. 6.

As illustrated by the examples of FIGS. 3-8C, embodiments of the present invention may implement basic logic gates by arranging specifically shaped prisms in exemplary configurations shown in the figures. But other arrangements of prisms are likewise capable of implementing the same basic functions, including arrangements that comprise prisms with different numbers of surfaces or different physical shapes, or that have different patterns of shading.

Embodiments of the present invention are flexible enough to accommodate any sort of variation of or alternative to the examples shown in the figures that is desired by an implementer or that is deemed to be more efficient, cost-effective, easier to manufacture, compatible with extrinsic systems, or otherwise preferable to the sample gate structures shown in the figures. Such logic-design choices may be selected by a human circuit designer or by computerized design software, using at methodology analogous to known methods of logic design.

At the conclusion of step 930, the processor will have selected one or more sets of prisms and determined how to arrange and shade those prisms order to implement logic identified in step 900.

As described above, this task may be performed by straightforwardly implementing each logic gate identified in step 910 as an independent structure similar to those illustrated in FIGS. 3-8C, and then assembling those structures in a sequence defined by the logical structure identified in step 910. But many other structures are capable of performing the same logical functions, and embodiments of the present invention may accommodate any such structure that is desired by an implementer.

In step 930, the prisms, quantum dots, and shading specified in step 920 are generated. This step may be performed by any means known in the art, including those described above in the opening to the DETAILED DESCRIPTION section.

In step 940, the elements created in step 930 are organized into structures specified in step 920. In some embodiments, steps 930 and 940 may be combined into a single step that generates the desired shaded crystals in the desired nanostructure.

In step 950, the structure or structures created in steps 930 and 940 are tested to confirm that they properly implemented the logic identified in step 900. This testing may be performed by any means known in the art, such as by submitting input signals to the logic circuit and verifying that resulting output signals properly implement the logic identified in step 900.

In some cases, this testing may be performed in a more granular manner, by providing input to and identifying output of individual gates or subsystems of the logic circuit. Depending on the fabrication technology used, this more granular testing may need to be performed prior to the final assembly of step 940.

Testing may be performed by use of any known type of test signal used to validate photonic signals, such as a light signal generated by an optical laser or by an ultraviolet light.

What is claimed is:

1. A media-defined optical logic circuit capable of performing a logical operation, the circuit comprising:
a set of polyhedral prisms physically arranged such that each prism of the set of polyhedral prisms is adjacent to at least one other prism of the set of polyhedral prisms,
where a quantum dot is embedded into each prism of the set of polyhedral prisms,
where a first prism of the set of polyhedral prisms is adjacent to a second prism of the set of polyhedral prisms,
where the second prism is adjacent to a third prism of the set of polyhedral prisms,
where a sufficiently energetic first photonic signal generated by a quantum dot embedded into the first prism is capable of exciting a second quantum dot embedded into the second prism to emit a second photonic signal capable of exciting a third quantum dot embedded into the third prism to emit a third photonic signal,
where each emitted photonic signal represents a binary value of a logic function,
where the physical arrangement of the set of polyhedral prisms is chosen so as to route photonic signals emitted by the set of polyhedral prisms along paths that represent operations of the binary logic function,
where the physical arrangement of the set of polyhedral prisms is chosen so as allow the circuit to receive a set of photonic input signals through surfaces of one or more input prisms of the set of polyhedral prisms,
where the physical arrangement of the set of polyhedral prisms is chosen so as allow the circuit to emit a set of photonic output signals through circuit-output surfaces of one or more circuit-output prisms of the set of polyhedral prisms,
where one or more surfaces of the first prism are completely or partially shaded,
where a completely shaded surface completely blocks a photonic signal and a partially shaded surface attenuates a photonic signal to a degree proportional to the degree of partial shading,
where each shaded surface is selected so as to configure the photonic signal paths or the circuit to represent logical elements of the binary logic operation,
where a single attenuated signal cannot excite a quantum dot, embedded into a fourth prism of the set of polyhedral prisms, to emit a photonic signal if the attenuated signal's degree of attenuation exceeds a predetermined attenuation value, and
where multiple signals entering the fourth prism excite the quantum dot embedded into the fourth prison to emit a photonic signal if the combined intensity of the multiple signals exceeds a predetermined light-intensity value.

2. The circuit of claim 1, where a first photonic signal represents a bit of a binary data, and where an intensity of the first photonic signal determines a state of the bit of binary data.

3. The circuit of claim 1, further comprising:
a switch prism of the set of polyhedral prisms, physically adjacent to one or more signal-generating prisms of the set of polyhedral prisms, that is capable of responding to a photonic switching signal, received through a switching-input surface of the switch prism, by selectively blocking photonic signals received, through signal-input surfaces of the switch prism, from the one or more signal-generating prisms.

4. The circuit of claim 3, where the switch prism performs a logical NOT operation upon a logical element represented by a single photonic data signal received from a single adjacent prism of the one or more signal-generating prisms.

5. The circuit of claim 1,
where an intensity of light emitted by an excited quantum dot embedded into a prism of the set of polyhedral prisms is determined by one or more physical characteristics of the excited quantum dot, and
where the one or more physical characteristics of the excited quantum dot are selected from the group consisting of: a physical dimension of the excited quantum dot, a material of composition of the excited quantum dot, and a shape of the excited quantum dot.

6. A method of forming an optical logic circuit, the method comprising:
physically arranging a set of polyhedral prisms such that each prism of the set of polyhedral prisms is adjacent to at least one other prism of the set of polyhedral prisms,
where a quantum dot is embedded into each prism of the set of polyhedral prisms,
where a first prism of the set of polyhedral prisms is adjacent to a second prism of the set of polyhedral prisms,
where the second prism is adjacent to a third prism of the set of polyhedral prisms,
where a sufficiently energetic first photonic signal generated by a quantum dot embedded into the first prism is capable of exciting a second quantum dot embedded into the second prism to emit a second photonic signal capable of exciting a third quantum dot embedded into the third prism to emit a third photonic signal,
where each emitted photonic signal represents a binary value of a logic function,
where the physical arrangement of the set of polyhedral prisms is chosen so as to route photonic signals emitted by the set of polyhedral prisms along paths that represent operations of the binary logic function,
where the physical arrangement of the set of polyhedral prisms is chosen so as allow the circuit to receive a set of photonic input signals through surfaces of one or more input prisms of the set of polyhedral prisms,
where the physical arrangement of the set of polyhedral prisms is chosen so as allow the circuit to emit a set of photonic output signals through circuit-output surfaces of one or more circuit-output prisms of the set of polyhedral prisms,
where one or more surfaces of the first prism are completely or partially shaded,
where a completely shaded surface completely blocks a photonic signal and a partially shaded surface attenuates a photonic signal to a degree proportional to the degree of partial shading,
where each shaded surface is selected so as to configure the photonic signal paths or the circuit to represent logical elements of the binary logic operation,
where a single attenuated signal cannot excite a quantum dot, embedded into a fourth prism of the set of polyhedral prisms, to emit a photonic signal if the attenuated signal's degree of attenuation exceeds a predetermined attenuation value, and
where multiple signals entering the fourth prism excite the quantum dot embedded into the fourth prison to emit a photonic signal if the combined intensity of the multiple signals exceeds a predetermined light-intensity value.

7. The method of claim 6, where a first photonic signal represents a bit of a binary data, and where an intensity of the first photonic signal determines a state of the bit of binary data.

8. The method of claim 6, further comprising:
a switch prism of the set of polyhedral prisms, physically adjacent to one or more signal-generating prisms of the set of polyhedral prisms, that is capable of responding to a photonic switching signal, received through a switching-input surface of the switch prism, by selectively blocking photonic signals received, through signal-input surfaces of the switch prism, from the one or more signal-generating prisms.

9. The method of claim 8, where the switch prism performs a logical NOT operation upon a logical element represented by a single photonic data signal received from a single adjacent prism of the one or more signal-generating prisms.

10. A method of using an optical logic circuit, the method comprising:
submitting to the optical logic circuit, by means of external light sources, a set of photonic circuit-input signals,
where the optical logic circuit comprises a set of polyhedral prisms physically arranged such that each prism of the set of polyhedral prisms is adjacent to at least one other prism of the set of polyhedral prisms,
where a quantum dot is embedded into each prism of the set of polyhedral prisms,
where a first prism of the set of polyhedral prisms is adjacent to a second prism of the set of polyhedral prisms,
where the second prism is adjacent to a third prism of the set of polyhedral prisms,
where a sufficiently energetic first photonic signal generated by a quantum dot embedded into the first prism is capable of exciting a second quantum dot embedded into the second prism to emit a second photonic signal capable of exciting a third quantum dot embedded into the third prism to emit a third photonic signal,
where each emitted photonic signal represents a binary value of a logic function,
where the physical arrangement of the set of polyhedral prisms is chosen so as to route photonic signals emitted by the set of polyhedral prisms along paths that represent operations of the binary logic function,
where the physical arrangement of the set of polyhedral prisms is chosen so as allow the circuit to receive a set of photonic input signals through surfaces of one or more input prisms of the set of polyhedral prisms,
where the physical arrangement of the set of polyhedral prisms is chosen so as to allow the circuit to emit a set of photonic output signals through circuit-output surfaces of one or more circuit-output prisms of the set of polyhedral prisms,
where one or more surfaces of the first prism are completely or partially shaded,
where a completely shaded surface completely blocks a photonic signal and a partially shaded surface attenuates a photonic signal to a degree proportional to the degree of partial shading,
where each shaded surface is selected so as to configure the photonic signal paths or the circuit to represent logical elements of the binary logic operation,
where a single attenuated signal cannot excite a quantum dot, embedded into a fourth prism of the set of polyhedral prisms, to emit a photonic signal if the attenuated signal's degree of attenuation exceeds a predetermined attenuation value, and
where multiple signals entering the fourth prism excite the quantum dot embedded into the fourth prison to emit a photonic signal if the combined intensity of the multiple signals exceeds a predetermined light-intensity value.

11. The method of claim 10, where a first photonic signal represents a bit of a binary data, and where an intensity of the first photonic signal determines a state of the bit of binary data.

12. The method of claim 10, further comprising:
a switch prism of the set of polyhedral prisms, physically adjacent to one or more signal-generating prisms of the set of polyhedral prisms, that is capable of responding to a photonic switching signal, received through a switching-input surface of the switch prism, by selectively blocking photonic signals received, through signal-input surfaces of the switch prism, from the one or more signal-generating prisms.

13. The method of claim 12, where the switch prism performs a logical NOT operation upon a logical element represented by a single photonic data signal received from a single adjacent prism of the one or more signal-generating prisms.

14. The method of claim 10,
where an intensity of light emitted by an excited quantum dot embedded into a prism of the set of polyhedral prisms is determined by one or more physical characteristics of the excited quantum dot, and
where the one or more physical characteristics of the excited quantum dot are selected from the group consisting of: a physical dimension of the excited quantum dot, a material of composition of the excited quantum dot, and a shape of the excited quantum dot.

* * * * *